(12) United States Patent
Yamamoto (10) Patent No.: US 6,995,450 B2
(45) Date of Patent: Feb. 7, 2006

(54) SEMICONDUCTOR DEVICE WITH A FREQUENCY SELECTIVE GUARD RING

(75) Inventor: Ryota Yamamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/832,430

(22) Filed: Apr. 27, 2004

(65) Prior Publication Data

US 2004/0212039 A1    Oct. 28, 2004

(30) Foreign Application Priority Data

Apr. 28, 2003   (JP) ............................. 2003-124411

(51) Int. Cl.
*H01L 29/00* (2006.01)
(52) U.S. Cl. .................. 257/531; 257/376; 257/394; 257/409; 257/379; 257/516; 257/528; 257/532
(58) Field of Classification Search ............... 257/127, 257/170, 339, 409, 372–376, 394–400, 452, 257/484, 490, 516, 493–495, 379–381, 528–543, 257/903, 904, 919, 924, 927, 154, 350, 358, 257/359, 363
See application file for complete search history.

(56) References Cited

U.S. PATENT DOCUMENTS 5,475,255 A * 12/1995 Joardar et al. ............... 257/547
6,002,161 A * 12/1999 Yamazaki ..................... 257/531

FOREIGN PATENT DOCUMENTS

JP    H9-326468 A    12/1997
JP    2001-044277 A   2/2001

* cited by examiner

*Primary Examiner*—Andy Huynh
(74) *Attorney, Agent, or Firm*—Sughrue Mion, PLLC

(57) ABSTRACT

A ring-shaped $P^+$ type diffusion region is formed on the top surface of a P type substrate in such a way as to surround a single internal circuit region. A shunt wiring is formed in an area including directly above the $P^+$ type diffusion region on the P type substrate. The shunt wiring is connected to the $P^+$ type diffusion region by a plurality of contacts. The shunt wiring is provided with an annular ring portion surrounding the internal circuit region. A meander inductor led out from the ring portion and the one end of the meander inductor is connected to a ground potential wiring. A resonance circuit is formed by a parasitic capacitor and the inductance of the shunt wiring. The parasitic capacitor is formed between the shunt wiring and the $P^+$ type diffusion region on the P type substrate.

14 Claims, 9 Drawing Sheets

SEMICONDUCTOR DEVICE WITH A FREQUENCY SELECTIVE GUARD RING

BACKGROUND OF THE INVENTION

1. Field of the Invention

The present invention relates to a semiconductor device having a guard ring.

2. Description of the Related Art

A semiconductor device has a plurality of circuit regions formed on a single semiconductor substrate. Therefore, noise generated from a single circuit region may be transmitted to another circuit region and influence the operation of a circuit therein. This influence is particularly serious in a system LSI which has both a digital circuit and an analog circuit for an analog circuit is particularly apt to be influenced by substrate noise.

Figure 1:
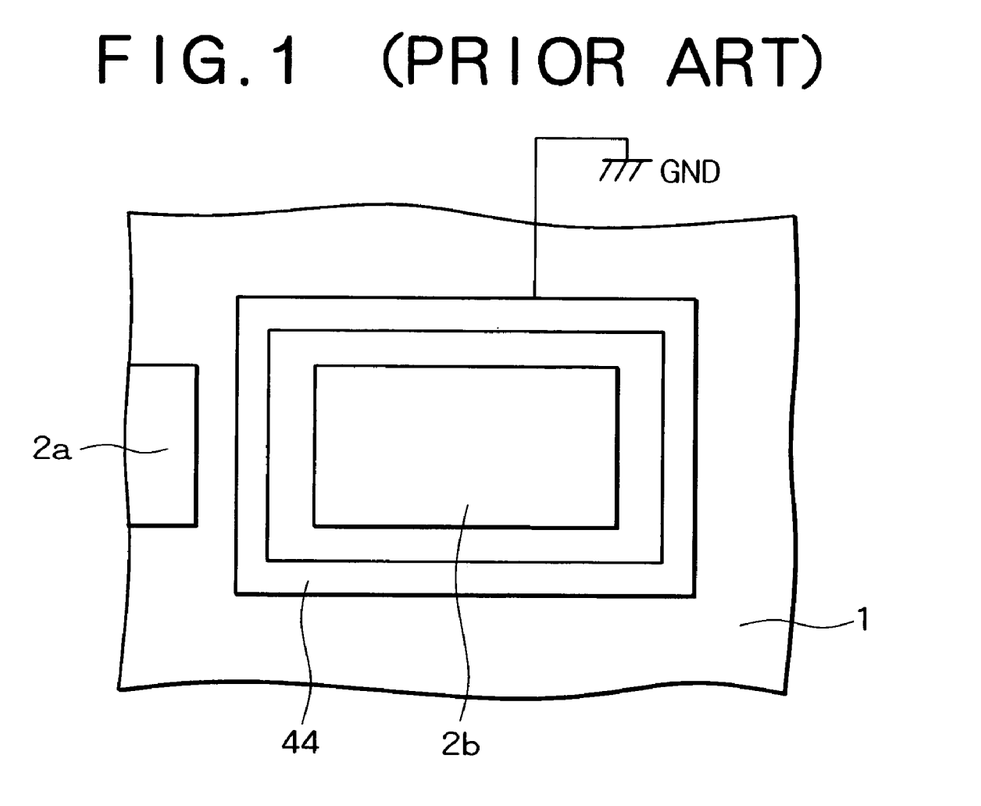
FIG. 1 is a plan view showing a conventional semiconductor device having a guard ring.

For example, Japanese Patent Laid-Open Publication No. H9-326468/1997 and Japanese Patent Laid-Open Publication No. 2001-44277 disclose techniques of forming a guard ring between a circuit region where a circuit to be a noise source is formed (hereinafter called "noise source circuit region") and a circuit region where a circuit susceptible to substrate noise is formed (hereinafter called "damageable circuit region" in order to restrain propagation of substrate noise. FIG. 1 is a plan view showing a conventional semiconductor device having a guard ring.

As shown in FIG. 1, internal circuit regions 2a and 2b are formed apart from each other on and above the top surface of the P type substrate 1. For instance, the internal circuit region 2a is a noise source circuit region and the internal circuit region 2b is a damageable circuit region. A P$^+$ type diffusion region (not shown) is formed on the top surface of the P type substrate 1 in such a way as to surround the internal circuit region 2b and serves as a guard ring. A shunt wiring 44 is formed directly above the P$^+$ type diffusion region and is connected to the P$^+$ type diffusion region by a plurality of contacts (not shown). The shunt wiring 44 is connected to a ground potential wiring GND to be applied with the ground potential.

In the conventional semiconductor device shown in FIG. 1, the ground potential is applied to the guard ring, comprised of the P$^+$ type diffusion region, via the ground potential wiring GND, the shunt wiring 44 and the contacts. As part of substrate noise generated from the internal circuit region 2a is absorbed by the P$^+$ type diffusion region, the propagation of the substrate noise to the internal circuit region 2b is restrained.

Figure 2:
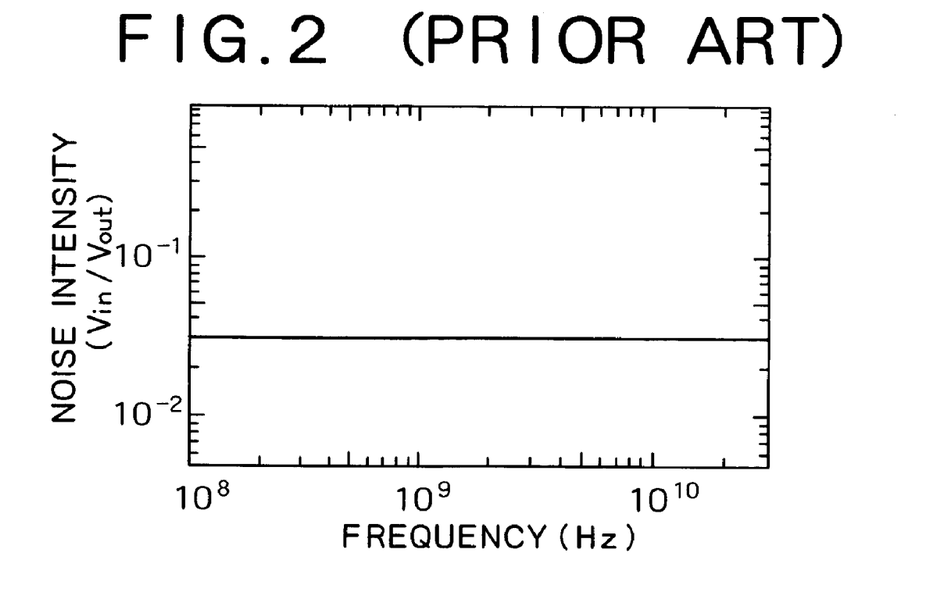
FIG. 2 is a graph showing the frequency dependency of the performance of the guard ring shown in FIG. 1, taking the frequency of substrate noise on the horizontal axis and taking on the vertical axis the intensity of substrate noise which propagates over the guard ring to a damageable circuit region.

The prior art however has the following problem. FIG. 2 is a graph showing the frequency dependency of the performance of the guard ring of the semiconductor device shown in FIG. 1, taking the frequency of substrate noise on the horizontal axis and taking on the vertical axis the intensity of substrate noise which propagates over the guard ring (P$^+$ type diffusion region) to a damageable circuit region (internal circuit region 2b). As shown in FIG. 2, the frequency dependency is hardly seen in the performance of the guard ring. In case where a specific frequency component in substrate noise is strong, such as a case where the internal circuit region 2a (noise source circuit region) is a clock circuit region, therefore, this frequency component cannot be eliminated sufficiently. Depending on the type of a circuit to be formed in the damageable circuit region, the circuit may be particularly susceptible to a specific frequency component. The prior art cannot adequately protect the circuit in the damageable circuit region even in such a case.

SUMMARY OF THE INVENTION

Accordingly, it is an object of the present invention to provide a semiconductor device having a guard ring capable of selectively eliminating a desired frequency component in substrate noise.

A semiconductor device according to the present invention comprises a semiconductor substrate having a plurality of circuit regions formed on a top surface thereof; a conductive region formed between two circuit regions of the plurality of circuit regions and formed on the top surface of the semiconductor substrate; a wiring which is provided on the semiconductor substrate to be connected to the conductive region and forms a capacitor together with the conductive region on the semiconductor substrate when applied with a reference potential; and an inductor which is connected to the wiring and forms a resonance circuit together with the capacitor.

According to the present invention, the conductive region becomes a guard ring for a circuit region. The resonance circuit is connected to the guard ring. Accordingly, the guard ring can particularly effectively absorb that frequency component in the substrate noise which is equivalent to the resonance frequency of the resonance circuit, so that the noise absorption of the guard ring can be given a frequency dependency. As a result, the desired frequency component in substrate noise can be absorbed selectively by controlling the capacitance of the capacitor or the inductance of the inductor. The plural circuit regions are some parts of the entire circuit network of the semiconductor device which have specific functions and circuits formed respectively in the circuit regions may be connected to one another.

It is preferable that one end of the inductor be connected to the wiring and the other end of the inductor is applied with the reference potential. This connects the inductor and the wiring in series between the power line for supplying the reference potential and the conductive region. Consequently, a specific frequency component can be absorbed more effectively.

The semiconductor device may further comprises a capacitor having one end connected to the wiring. This can make the capacitance of the capacitor which constitutes the resonance circuit greater than the capacitance between the wiring and the conductive region on the semiconductor substrate, so that the range of the settable resonance frequency can be widened. At this time, it is preferable that the other end of the capacitor be connected to the conductive region.

It is preferable that the wiring should be provided directly above the conductive region and have a contact to connect the wiring to the conductive region. This can make the distance between the wiring and the conductive region shorter, thereby increasing the capacitance between them. It is also possible to make the resistance between the wiring and the conductive region lower, so that substrate noise can be absorbed more effectively.

Another semiconductor device according to the invention comprises a semiconductor substrate having a plurality of circuit regions formed on a top surface thereof; a conductive region which is formed between two circuit regions of the plurality of circuit regions and formed on the top surface of the semiconductor substrate to be applied with a reference potential; a capacitor connected to the conductive region; and an inductor which is connected to the conductive region and forms a resonance circuit together with the capacitor.

In this semiconductor device of the invention, the conductive region becomes a guard ring for a circuit region. As the resonance circuit is connected to the guard ring, the guard ring can particularly effectively absorb that frequency component in the substrate noise which is equivalent to the resonance frequency of the resonance circuit. Accordingly, the desired frequency component in substrate noise can be eliminated selectively.

The inductor may be a meander inductor. This structure can allow the inductor to be formed on a single metal layer.

The inductor may be a spiral inductor. This can increase the inductance per unit area.

It is preferable that the conductive region be an area in the semiconductor substrate where an impurity is doped. This can allow the conductive region to be formed by an existing semiconductor process.

Further, it is preferable that the conductive region be formed in such a way as to surround one of the circuit regions. This structure can more effectively prevent propagation of substrate noise to the circuit region or propagation of substrate noise from the circuit region.

According to the invention, as a capacitor and an inductor are connected to a guard ring comprised of a conductive region, the desired frequency component in substrate noise can be absorbed selectively by controlling the capacitance of the capacitor or the inductance of the inductor. Even in case where a circuit in a noise source circuit region generates substrate noise of a specific frequency particularly intensely and case where a circuit in a damageable circuit region is particularly susceptible to substrate noise of a specific frequency, therefore, the circuit in the damageable circuit region can be protected effectively. Therefore, the invention is particularly effective in a system LSI or so which has both a digital circuit and an analog circuit.

DETAILED DESCRIPTION OF THE PREFERRED EMBODIMENTS

Figure 3:
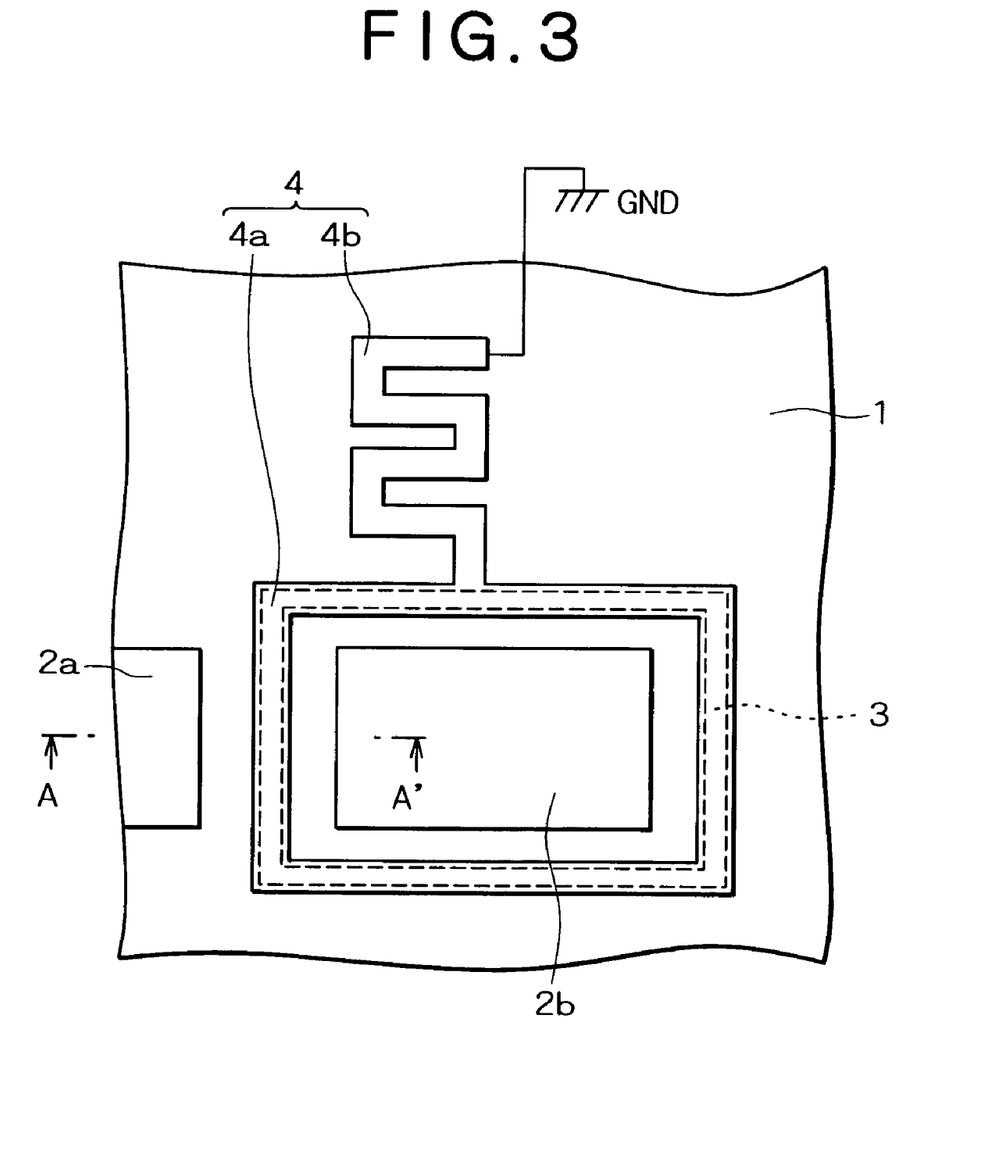
FIG. 3 is a plan view showing a semiconductor device according to a first embodiment of the invention.

Preferred embodiments of the invention are specifically described below with reference to the accompanying drawings. First, the first embodiment of the invention is dis-cussed. FIG. 3 is a plan view showing a semiconductor device according to the embodiment, FIG. 4 is a cross-sectional view along line A–A' in FIG. 3 and FIG. 5 is an equivalent circuit diagram showing a guard ring portion in this semiconductor device.

Figure 4:
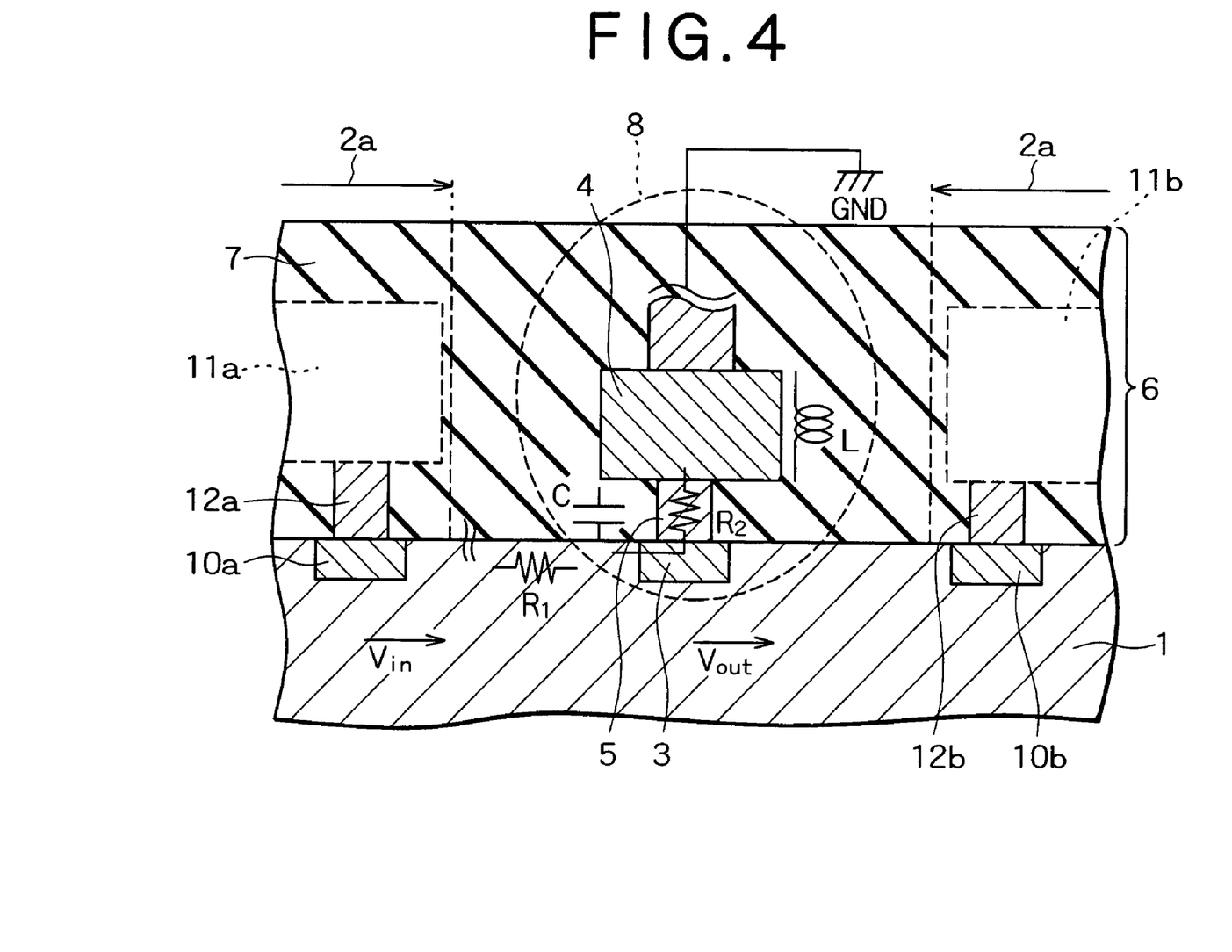
FIG. 4 is a cross-sectional view along line A–A' in FIG. 3.
Figure 5:
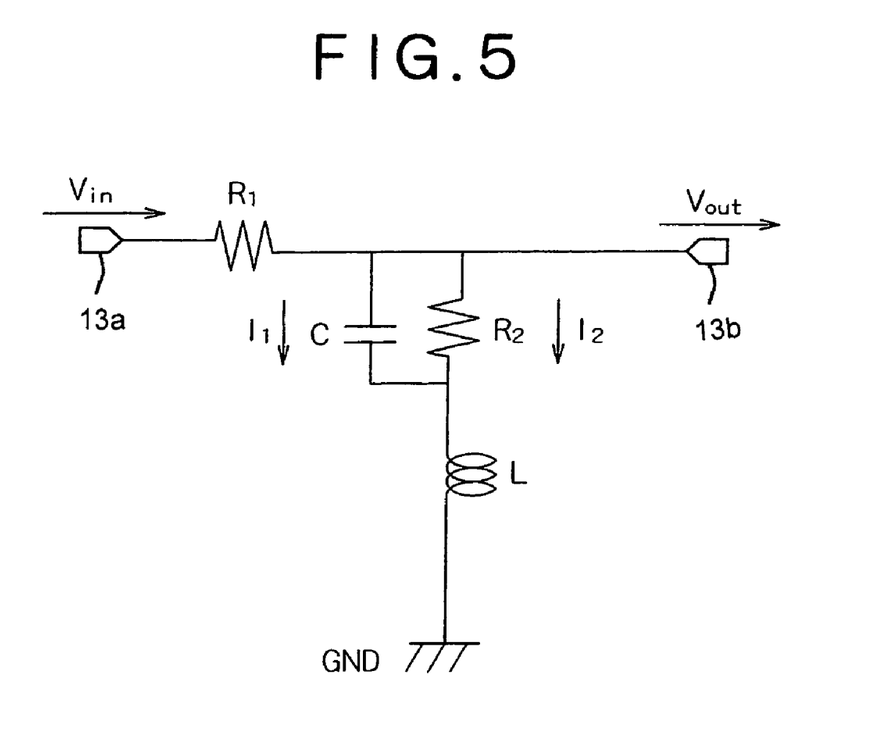
FIG. 5 is an equivalent circuit diagram showing a guard ring portion in this semiconductor device.

As shown in FIGS. 3 and 4, the semiconductor device according to the first embodiment is provided with a P type substrate 1 of, for example, P type silicon, on which a multilevel wiring layer 6 is provided. Internal circuit regions 2a and 2b are formed apart from each other on and above the top surface of the P type substrate 1. The internal circuit region 2a is a noise source circuit region where a noise source circuit is formed; for example, the internal circuit region 2a is a region where a digital circuit, such as a clock circuit, is formed. Besides the clock circuit, VCO (Voltage Controlled Oscillator) or so is a noise source circuit. The internal circuit region 2b is a damageable circuit region where a damageable circuit, such as an analog circuit, is formed. Although other circuit regions than the internal circuit regions 2a and 2b are provided in the semiconductor device, they are not shown in FIGS. 3 and 4.

A ring-shaped $P^+$ type diffusion region 3 is formed on the top surface of the P type substrate 1 in such a way as to surround the internal circuit region 2b. The $P^+$ type diffusion region 3 is a region formed by doping a P type impurity in the P type substrate 1. A guard ring is formed by this $P^+$ type diffusion region 3. Further, a shunt wiring 4 is formed in a region including directly above the $P^+$ type diffusion region 3 above the P type substrate 1. The shunt wiring 4 is formed on the first metal layer or the second metal layer in the multilevel wiring layer 6. A plurality of contacts 5 which connect the shunt wiring 4 to the $P^+$ type diffusion region 3 are provided between the $P^+$ type diffusion region 3 and the shunt wiring 4. The shunt wiring 4 and the contacts 5 are buried in an interlayer insulating film 7. The interlayer insulating film 7 is not illustrated in FIG. 3.

The shunt wiring 4 is provided with an annular ring portion 4a surrounding the internal circuit region 2b and a meander inductor 4b led out from the ring portion 4a. That is, one end of the meander inductor 4b is connected to the ring portion 4a as a wiring while the other end of the meander inductor 4b is connected to a power-source line capable of applying a given potential, e.g., a ground potential wiring GND. The ground potential wiring GND is a wiring different from the ground potential wiring that is connected to the internal circuit regions 2a and 2b and other circuit regions (not shown) in the semiconductor device. That is, the fixed potential that is applied to the shunt wiring 4 is independent of the fixed potential that is applied to the internal circuit regions.

As shown in FIG. 3, the meander inductor 4b is formed by a wiring processed in a waveform shape. A parasitic capacitance is formed between the shunt wiring 4 and the $P^+$ type diffusion region 3 on the P type substrate 1. And the parasitic capacitance and the inductance of the shunt wiring 4 form a resonance circuit. That is the meander inductor 4b as a wiring is given the inductance of the meander inductor 4b and the parasitic capacitance which is formed together with the $P^+$ type diffusion region 3 on the P type substrate 1. The $P^+$ type diffusion region 3, the contacts 5 and the shunt wiring 4 form a guard ring portion 8.

As shown in FIG. 4, a $P^+$ type diffusion region 10a is formed on the top surface of the P type substrate 1 in the internal circuit region 2a, and a wiring portion 11a is formed in the multilevel wiring layer 6. The wiring (not shown) in the wiring portion 11a is connected to the $P^+$ type diffusion region 10a by contacts 12a. Likewise, a $P^+$ type diffusion region 10b is formed on the top surface of the P type substrate 1 in the internal circuit region 2b, and a wiring portion 11b is formed in the multilevel wiring layer 6. The wiring (not shown) in the wiring portion 11b is connected to the P+ type diffusion region 10b by contacts 12b.

The following discusses the operation of the semiconductor device according to the embodiment constructed in the above-described manner. As shown in FIGS. 3 and 4, the P+ type diffusion region 3 as a guard ring is applied with the ground potential via the ground potential wiring GND, the shunt wiring 4 and the contacts 5. As the circuit in the internal circuit region 2a (noise source circuit region) is driven, substrate noise is generated from the P+ type diffusion region 10a in the internal circuit region 2a. Of the substrate noise, the noise that has been transmitted to the P+ type diffusion region 3 is absorbed by the P+ type diffusion region 3.

As mentioned above, the meander inductor 4b is given the parasitic capacitance and the inductance of the shunt wiring 4. The parasitic capacitance is formed between the shunt wiring 4 and the P+ type diffusion region 3 on the P type substrate 1. As the parasitic capacitance and the inductance are connected to each other, they form a sort of resonance circuit. Accordingly, that frequency component in the substrate noise which is equivalent to the resonance frequency of the resonance circuit is particularly effectively absorbed. That is, the performance of the guard ring comprised of the P+ type diffusion region 3 shows a frequency dependency and selectively absorbs the frequency component equivalent to the resonance frequency.

The following gives the detailed description of the operation of the guard ring in the embodiment to selectively absorb a specific frequency component. As shown in FIG. 4, given that a substrate noise voltage generated from the noise source circuit region (internal circuit region 2a) is $V_{in}$, a substrate noise voltage after passing the guard ring (P+ type diffusion region 3 is $V_{out}$, a substrate resistance between the noise source circuit region internal circuit region 2a) and the guard ring (P+ type diffusion region 3) is $R_1$, the resistance of the contacts 5 between the P+ type diffusion region 3 and the shunt wiring 4 is $R_2$, the parasitic capacitance between the shunt wiring 4 and the P+ type diffusion region 3 on the P type substrate 1 is C, and the inductance of the shunt wiring 4 is L, the guard ring portion 8 can be expressed by an equivalent circuit shown in FIG. 5.

The individual structural elements of the equivalent circuit shown in FIG. 5 are circuit elements having the aforementioned physical quantities. That is, the resistor $R_1$ shown in FIG. 5 is a resistor having the reference resistance $R_1$, the resistor $R_2$ is a resistor having the reference $R_2$ of the contacts 5, the capacitor C is a capacitor having the aforementioned capacitance C, and the inductor L is an inductor having the inductance L of the shunt wiring 4. A terminal 13a shown in FIG. 5 is the terminal to which the voltage $V_{in}$ is input, and a terminal 13b is the terminal from which the voltage $V_{out}$ is output.

In the equivalent circuit expressing the guard ring portion 8, as shown in FIG. 5, the resistor R, is connected between the terminal 13a and the terminal 13b. The resistor $R_2$ and the inductor L are connected in series between the node between the resistor $R_1$ and the terminal 13b and the ground potential in the direction of the ground potential from the node.

Given that the value of the current flowing across the capacitor C is $I_1$, the value of the current flowing across the resistor $R_2$ is $I_2$ and the angular frequency of the substrate noise is ω, the following equations 1 to 3 are derived from FIG. 5 where j indicates an imaginary number.

$$V_{out} = V_{in} - R_1 \times (I_1 + I_2) \quad \text{(Equation 1)}$$

$$V_{out} - \frac{I_1}{j \times \omega \times C} - j \times \omega \times L \times (I_1 + I_2) = 0 \quad \text{(Equation 2)}$$

$$V_{out} - R_2 \times I_2 - j \times \omega \times L \times (I_1 + I_2) = 0 \quad \text{(Equation 3)}$$

The current values $I_1$ and $I_2$ are eliminated from the equations 1 to 3. The following equation 4 is derived from the equation 2 and the equation 3. Substituting the equation 4 into the equation 3 yields the following equation 5.

$$I_2 = \frac{I_1}{j \times \omega \times C \times R_2} \quad \text{(Equation 4)}$$

$$I_1 = \frac{j \times \omega \times C \times R_2}{R_2 + (j \times \omega)^2 \times L \times C \times R_2 + j \times \omega \times L} \quad \text{(Equation 5)}$$

Substituting the equation 5 into the equation 1 yields the following equation 6. With s=j×ω in the equation 6 and taking the ratio of $V_{out}$ to $V_{in}$, the equation 6 can be rewritten as the following equation 7. In the equation 7, H(s) is the transfer function of the equivalent circuit shown in FIG. 5.

$$V_{out} = \frac{L \times C \times R_2 \times (j \times \omega)^2 + L \times (j \times \omega) + R_2}{L \times C \times R_2 \times (j \times \omega)^2 + (L \times C \times R_1 \times R_2) \times (j \times \omega) + R_1 + R_2} \times V_{in} \quad \text{(Equation 6)}$$

$$H(s) = \frac{V_{out}}{V_{in}} \quad \text{(Equation 7)}$$

$$= \frac{s^2 + \frac{1}{C \times R_2} \times s + \frac{1}{L \times C}}{s^2 + \frac{L \times C \times R_1 \times R_2}{L \times C \times R_2} \times s + \frac{R_1 + R_2}{L \times C \times R_2}}$$

Meanwhile, the standard form of the ordinary-secondary transfer function can be described as in the following equation 8. In the equation 8, K indicates the gain of a circuit region, $\omega_P$ indicates the angular frequency of the pole, $\omega_z$ indicates the angular frequency at the zero point, $Q_P$ indicates the amplitude of the pole and $Q_z$ indicates the amplitude at the zero point.

$$H(s) = K \times \frac{\omega_p^2}{\omega_z^2} \times \frac{s^2 + \frac{\omega_z}{Q_z} \times s + \omega_z^2}{s^2 + \frac{\omega_p}{Q_p} \times s + \omega_p^2} \quad \text{(Equation 8)}$$

Figure 6:
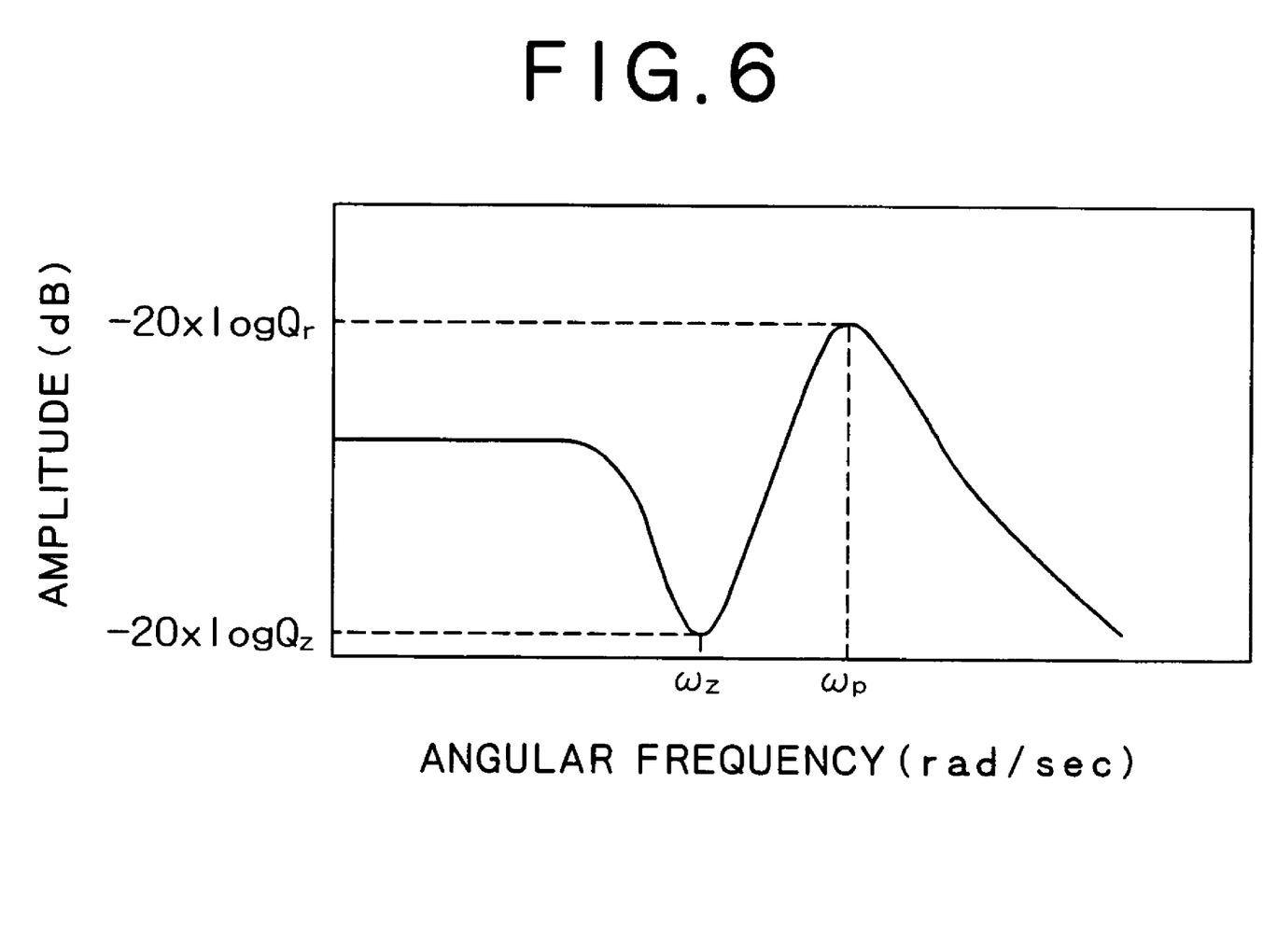
FIG. 6 is a Bode diagram showing an equation 8, taking an angular frequency ω (rad/sec) on the horizontal axis and amplitude (=20×log|H(s)|(db)) on the vertical axis.

FIG. 6 is a Bode diagram showing the equation 8, taking the angular frequency ω (rad/sec) on the horizontal axis and amplitude (=20×log|H(s)|(db)) on the vertical axis. In FIG. 6, $\omega_z < \omega_P$ and the individual points mean the aforementioned constants. When the angular frequency is $\omega_z$, as shown in FIG. 6, the amplitude or the value of the transfer function H(s) becomes minimum. It is therefore apparent that the attenuation band frequency or the frequency component noise that can be absorbed most effectively by the guard ring is $\omega_z$. Comparing the equation 7 with the equation 8, the attenuation band frequency $\omega_z$ is expressed by the following equation 9. It is understood from the equation 9 that noise of the desired frequency can be attenuated by controlling the inductance L or the capacitance C.

$$\omega_z = \sqrt{\frac{1}{L \times C}} \quad \text{(Equation 9)}$$

Next, computation is made by setting specific values in the equation 7. In case of a P type substrate, let the sheet resistance of the P type substrate be 10 Ωm, let the distance between the noise source circuit region (internal circuit region 2a) and the guard ring (P+ type diffusion region 3) be 20 μm, and let the length of the guard-ring disposed between the noise source circuit region and the damageable circuit region (internal circuit region 2b) in the direction orthogonal to the direction toward the damageable circuit region from the noise source circuit region be 100 μm. Then, given that noise mainly propagates in the substrate surface at the depth of 2 μm, the substrate resistance $R_1$ can be computed from the following equation 10.

$$R_1 = 10 \times \frac{20 \times 10^{-4}}{100 \times 10^{-4} \times 2 \times 10^{-4}} = 10000 \, \Omega \quad \text{(Equation 10)}$$

The contact resistance $R_2$ is set to $R_2 = 100$ Ω in consideration of the substrate resistance or so in addition to the contact resistance between the P type-substrate and the shunt wiring.

Further, assuming that the capacitance C is the capacitance between the first metal layer and the substrate, the capacitance is set to C=0.5 pF.

In case where the following equation 11 is satisfied from the equation 9 and the frequency to attenuate a signal is designed to be 2.5 GHz, the following equation 12 is derived from the equation 11.

$$2 \times \pi \times f = \sqrt{\frac{1}{L \times C}} \quad \text{(Equation 11)}$$

$$L = \frac{1}{C \times (2 \times \pi \times f)^2} \quad \text{(Equation 12)}$$
$$= \frac{1}{1 \times 10^{-12} \times (2 \times \pi \times 2.5 \times 10^9)^2} \cong 4.05 \text{ nH}$$

It is therefore apparent that in case where the frequency to attenuate a signal is 2.5 GHz, the inductor L should be so designed as to have an inductance of 4.05 nH. Such an inductor L is equivalent to a 6-turn inductor which has, for example, an inside diameter of 4 μm, a wiring width of 1.8 μm and a distance of 2.24 μm between wirings. Substituting the individual values of $R_1$, $R_2$, L and C in the equation 7 yields the following equation 13.

$$H(s) = \frac{s^2 + 2.0 \times 10^{10} \times s + 4.94 \times 10^{20}}{s^2 + 2.49 \times 10^{12} \times s + 4.99 \times 10^{22}} \quad \text{(Equation 13)}$$

Figure 7:
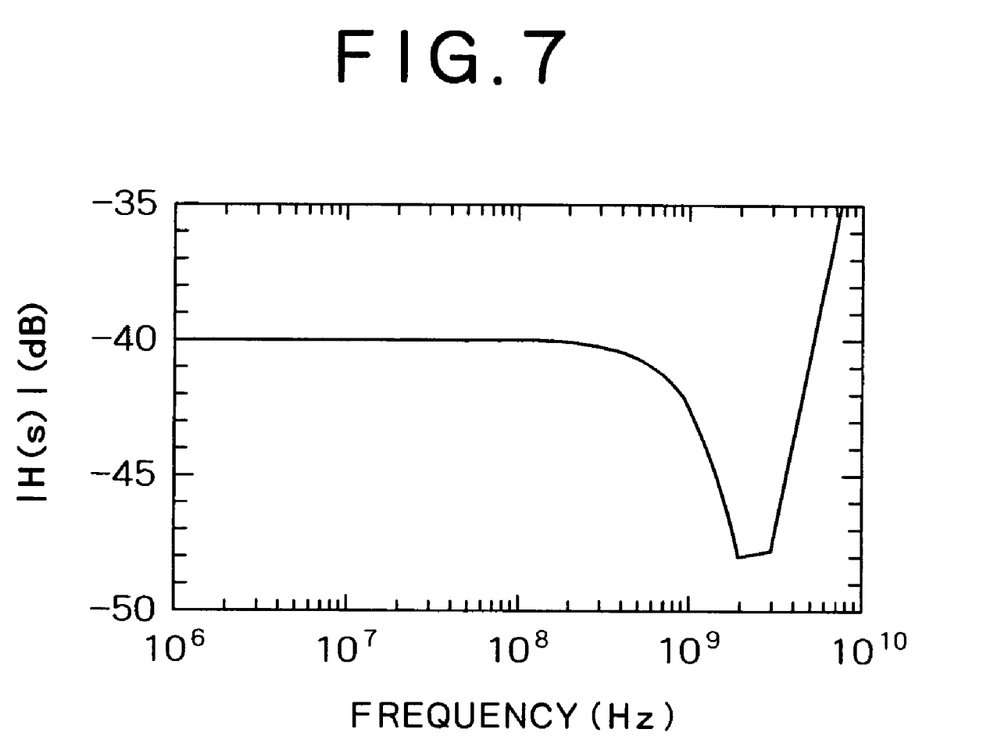
FIG. 7 is a graph showing an equation 13, taking the frequency of substrate noise on the horizontal axis and taking on the vertical axis the intensity of substrate noise which propagates over the guard ring to the damageable circuit region.

FIG. 7 is a graph showing the equation 13, taking the frequency of substrate noise on the horizontal axis and taking the intensity of substrate noise which propagates over the guard ring to the damageable circuit region (internal circuit-region 2b), i.e., the transfer function H(s) as a complex function, on the vertical axis. It is apparent from FIG. 7 that the desired frequency-component (2.5 GHz) is absorbed.

According to the embodiment, as described above, as a resonance circuit having the capacitance C between the shunt wiring 4 and the P+ type diffusion region 3 on the P type substrate 1, and the inductance L of the shunt wiring 4 is connected between the guard ring comprised of the P+ type diffusion region 3 the ground potential wiring GND, the impedance between the ground potential wiring GND and the P+ type diffusion region 3 is reduced significantly with respect to the resonance frequency of the resonance circuit and the substrate noise can be absorbed effectively. Therefore, controlling the capacitance of the capacitor C or the inductance of the inductor L can allow the guard ring to selectively absorb substrate noise of the desired frequency component. Even in case where a noise source circuit region (internal circuit region 2a) generates substrate noise of a specific frequency and case where a damageable circuit region (internal circuit region 2b) is susceptible to substrate noise of a specific frequency, therefore, the damageable circuit region can be protected against the substrate noise effectively.

As the ring portion 4a of the shunt wiring 4 is provided directly above the P+ type diffusion region 3 and the ring portion 4a is connected to the P+ type diffusion region 3 by the plural contacts 5, the distance between the shunt wiring 4 and the P+ type diffusion region 3 can be made shorter. This can make the capacitance between them greater. It is also possible to make the resistance between the shunt wiring 4 and the P+ type diffusion region 3 lower, thus ensuring more effective absorption of the low-frequency component of the substrate noise.

As the inductor formed on the shunt wiring 4 is the meander inductor 4b, the inductor can be formed on a single metal layer. Further, as the guard ring is formed by the P+ type diffusion region 3, the guard ring can be formed easily by an existing semiconductor process. Furthermore, as the P+ type diffusion region 3 is formed in such a way as to surround the internal circuit region 2b, the internal circuit region 2b can effectively be protected even against the substrate noise that comes from other circuit regions than the internal circuit region 2a.

Even in the conventional semiconductor device shown in FIG. 1, the shunt wiring 44 has a parasitic inductance and a parasitic capacitor is produced between the shunt wiring 44 and the P type substrate 1. Because the parasitic inductance of the shunt wiring 44 is extremely small, however, it is difficult to acquire an adequate noise filter effect with the parasitic inductance and the parasitic capacitance alone. According to the embodiment, by way of contrast, the provision of the meander inductor 4b on the shunt wiring 4 can provide an adequate noise filter effect for the desired cutoff frequency.

Figure 8:
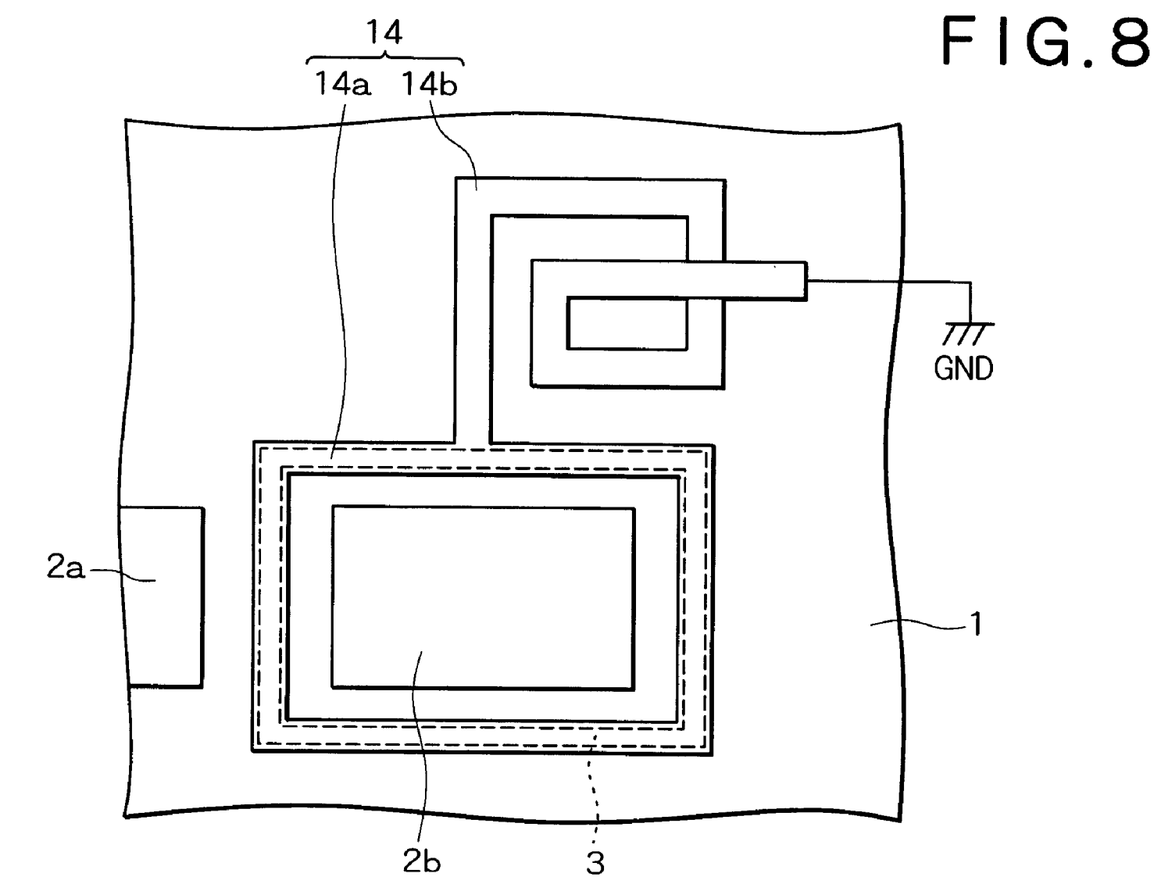
FIG. 8 is a plan view showing a semiconductor device according to a second embodiment of the invention.

The second embodiment of the invention is discussed below. FIG. 8 is a plan view showing a semiconductor device according to the embodiment. The cross-sectional view of the semiconductor device shown in FIG. 8 is similar to the cross-sectional view in FIG. 4. As shown in FIG. 8, this embodiment differs from the first embodiment illustrated in FIG. 3 in that a shunt wiring 14 is provided in place of the shunt wiring 4 (see FIG. 3). The shunt wiring 14 is provided with an annular ring portion 14a directly above the P+ type diffusion region 3. That is, the ring portion 14a is provided in such a way as to surround the internal circuit region 2b as seen from the direction perpendicular to the top surface of the P type substrate 1. A spiral inductor 14b is led out from the ring portion 14a. That is, the shunt wiring 14 comprises the ring portion 14a and the spiral inductor 14b. As shown in FIG. 8, the spiral inductor 14b is a wiring processed in a spiral form over the second metal layer. The other structure in the semiconductor device according to the embodiment is the same as the corresponding structure of the first embodiment.

As the shunt wiring 14 is provided with the spiral inductor 14b in the embodiment, the inductance per unit area of the shunt wiring can be designed larger as compared with the inductance in the first embodiment where the inductor provided is a meander inductor. To form a spiral inductor, however, it is necessary to use a minimum of two metal layers, which complicates the fabrication process as compared with that of the first embodiment. The other advantages in the embodiment are the same as those of the first embodiment.

Although the foregoing descriptions of the first and second embodiments have been given of an example where the $P^+$ type diffusion region 3 is provided in such a way as to surround the internal circuit region 2b or a damageable circuit region, the invention is not limited to this particular case and the $P^+$ type diffusion region 3 may be provided in such a way as to surround the noise source circuit region. This modification can prevent substrate noise generated from the noise source circuit region from leaking outside the $P^+$ type diffusion region 3, so that all the circuit regions of the semiconductor device excluding the noise source circuit region can be protected against the substrate noise. The $P^+$ type diffusion region 3 as a guard ring should not necessarily be formed in a ring shape, but has only to be disposed between the noise source circuit region and damageable circuit region. For instance, the guard ring may have an U-shape, an L shape or a belt shape. The following discusses cases where the guard ring has an U-shape and a belt shape.

Figure 9:
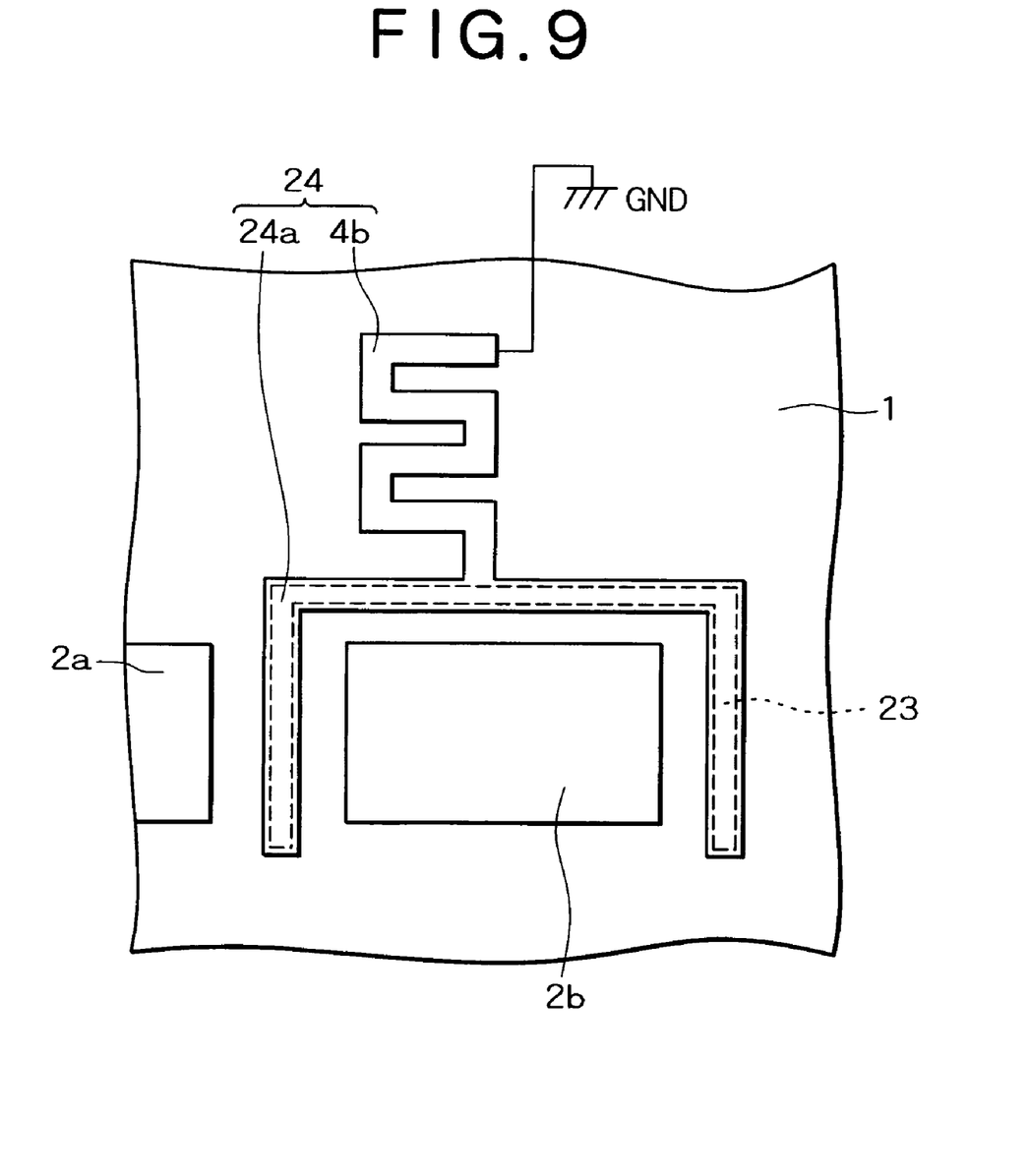
FIG. 9 is a plan view showing a semiconductor device according to a third embodiment of the invention.

The third embodiment of the invention is discussed below. FIG. 9 is a plan view showing a semiconductor device according to the embodiment. As shown in FIG. 9, this embodiment differs from the first embodiment illustrated in FIG. 3 in that a $P^+$ type diffusion region 23 having an U-shape is provided in place of the $P^+$ type diffusion region 3 (see FIG. 3) formed in a ring shape and a shunt wiring 24 having an U-shape portion 24a is provided instead of the shunt wiring 4 (see FIG. 3) having the ring portion 4a. The U-shape portion 24a is formed directly above the $P^+$ type diffusion region 23. The other structure in the semiconductor device according to the embodiment is the same as the corresponding structure of the first embodiment.

The third embodiment can reduce the areas of the guard ring and the shunt wiring as compared with the first embodiment. It is to be noted however that the effect of shielding substrate noise becomes smaller as compared with the first embodiment. The other advantages in the embodiment are the same as those of the first embodiment.

Figure 10:
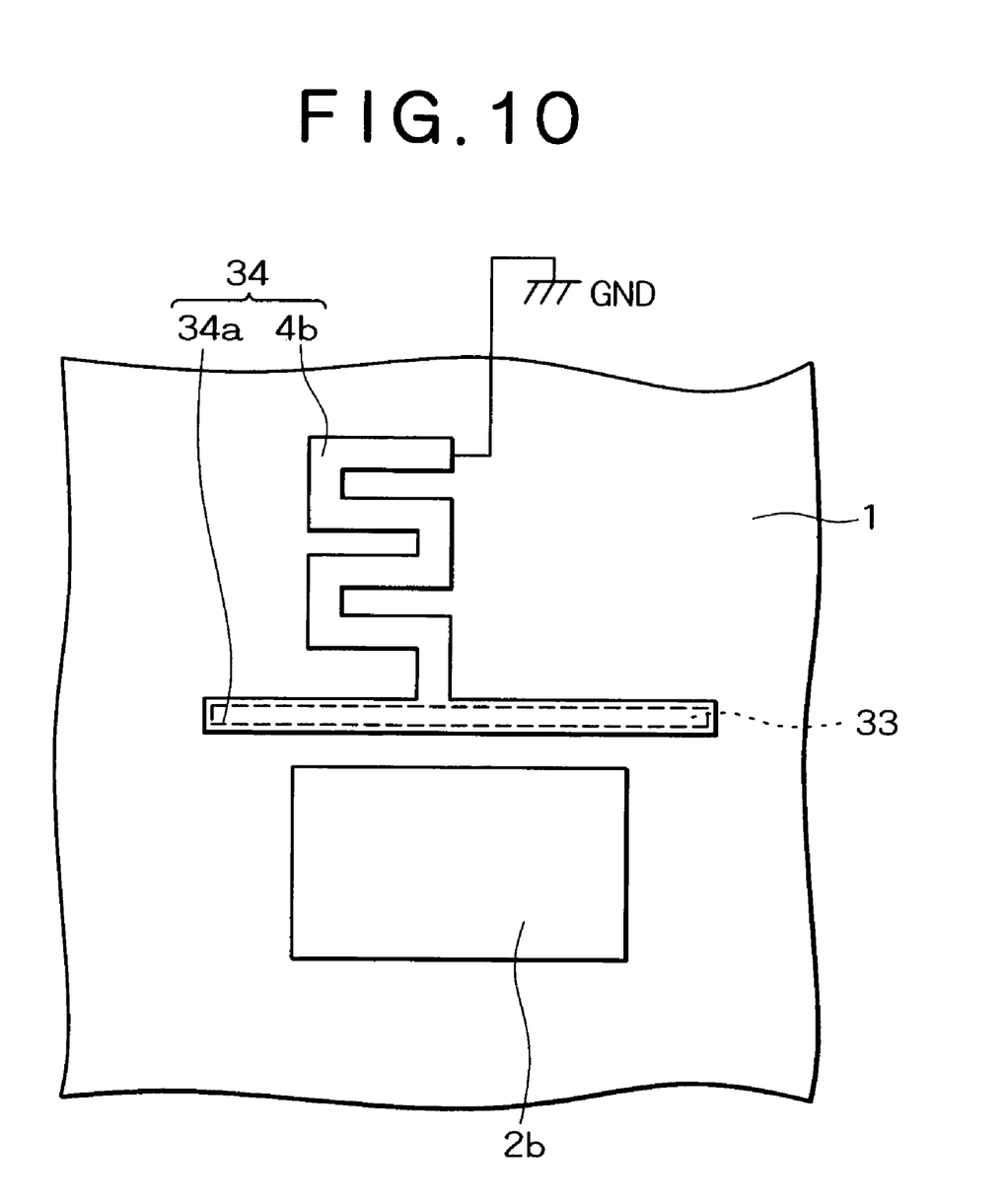
FIG. 10 is a plan view showing a semiconductor device according to a fourth embodiment of the invention.

The fourth embodiment of the invention is discussed below. FIG. 10 is a plan view showing a semiconductor device according to the embodiment. As shown in FIG. 10, this embodiment differs from the first embodiment illustrated in FIG. 3 in that a $P^+$ type diffusion region 33 having a belt shape is provided in place of the $P^+$ type diffusion region 3 (see FIG. 3) formed in a ring shape and a shunt wiring 34 having a belt-like portion 34a is provided instead of the shunt wiring 4 (see FIG. 3) having the ring portion 4a. The $P^+$ type diffusion region 33 is provided in the vicinity of the internal circuit region 2b and the distance between the $P^+$ type diffusion region 33 and the internal circuit region 2b is, for example, 5 $\mu$m or shorter. To secure the effect of shielding substrate noise, it is preferable that the $P^+$ type diffusion region 33 be provided between the noise source circuit region (not shown) and the damageable circuit region (internal circuit region 2b), and that side of the damageable circuit region (internal circuit region 2b) which does not face the guard ring ($P^+$ type diffusion region 33) should not face the noise source circuit region either. Further, the belt-like portion 34a of the shunt wiring 34 is formed directly above the $P^+$ type diffusion region 23. The other structure in the semiconductor device according to the embodiment is the same as the corresponding structure of the first embodiment.

The fourth embodiment can reduce the areas of the guard ring and the shunt wiring more than the third embodiment. It is to be noted however that the effect of shielding substrate noise becomes smaller as compared with the first embodiment. The other advantages in the embodiment are the same as those of the first embodiment.

Although the foregoing descriptions of the individual embodiments have been given of an example where the parasitic capacitor between the shunt wiring and the $P^+$ type diffusion region 3 on the P type substrate 1 is used as a capacitor, the present invention is not limited to this particular case and the desired capacitor may be provided between the shunt wiring and the $P^+$ type diffusion region 3. This can make the capacitance larger than the capacitance in the case where a parasitic capacitor alone is used as a capacitor, so that the frequency to attenuate a signal can be set in a wider range.

Although the entire shunt wiring is formed by the first metal layer or the second metal layer in the individual embodiments, the ring portion in the shunt wiring may be formed in the first metal layer or the second metal layer while the inductor may be formed on the topmost layer of the multilevel wiring layer.

Further, although the foregoing descriptions of the individual embodiments have been given of an example where the shunt wiring is provided on the P type substrate, the invention is not limited to this case. For example, the shunt wiring may not be provided and the capacitor and inductor may be provided directly above the $P^+$ type diffusion region. In this case, the end portion of the inductor on that side which is not connected to the $P^+$ type diffusion region may be applied with a given potential, such as the ground potential.

What is claimed is:

1. A semiconductor device comprising:
   a semiconductor substrate having a plurality of circuit regions formed on a top surface thereof;
   a conductive region formed between two circuit regions of said plurality of circuit regions and formed on said top surface of said semiconductor substrate;
   a wiring which is provided on said semiconductor substrate to be connected to said conductive region and forms a capacitor together with said conductive region on said semiconductor substrate when applied with a reference potential; and
   an inductor which is connected to said wiring and forms a resonance circuit together with said capacitor.

2. The semiconductor device according to claim 1, wherein one end of said inductor is connected to said wiring and the other end of said inductor is applied with said reference potential.

3. The semiconductor device according to claim 1, further comprising a capacitor having one end connected to said wiring.

4. The semiconductor device according to claim 3, wherein the other end of said capacitor is connected to said conductive region.

5. The semiconductor device according to claim 1, wherein said wiring is provided directly above said conductive region and has a contact to connect said wiring to said conductive region.

6. A semiconductor device comprising:
   a semiconductor substrate having a plurality of circuit regions formed on a top surface thereof;
   a conductive region which is formed between two circuit regions of said plurality of circuit regions and formed on said top surface of said semiconductor substrate to be applied with a reference potential;
   a capacitor connected to said conductive region; and
   an inductor which is connected to said conductive region and forms a resonance circuit together with said capacitor.

7. The semiconductor device according to claim 1, wherein said inductor is a meander inductor.

8. The semiconductor device according to claim 1, wherein said inductor is a spiral inductor.

9. The semiconductor device according to claim 1, wherein said conductive region is an area in said semiconductor substrate where an impurity is doped.

10. The semiconductor device according to claim 1, wherein said conductive region is formed in such a way as to surround one of said circuit regions.

11. The semiconductor device according to claim 6, wherein said inductor is a meander inductor.

12. The semiconductor device according to claim 6, wherein said inductor is a spiral inductor.

13. The semiconductor device according to claim 6, wherein said conductive region is an area in said semiconductor substrate where an impurity is doped.

14. The semiconductor device according to claim 6, wherein said conductive region is formed in such a way as to surround one of said circuit regions.

* * * * *